(12) United States Patent
Matsuoka et al.

(10) Patent No.: US 6,992,930 B2
(45) Date of Patent: Jan. 31, 2006

(54) SEMICONDUCTOR MEMORY DEVICE, METHOD FOR DRIVING THE SAME AND PORTABLE ELECTRONIC APPARATUS

(75) Inventors: Nobuaki Matsuoka, Tenri (JP); Masaru Nawaki, Nara (JP); Yoshinao Morikawa, Ikoma (JP); Hiroshi Iwata, Ikoma-gun (JP); Akihide Shibata, Nara (JP); Kohji Hamaguchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 51 days.

(21) Appl. No.: 10/836,907

(22) Filed: Apr. 30, 2004

(65) Prior Publication Data

US 2004/0222452 A1  Nov. 11, 2004

(30) Foreign Application Priority Data

May 8, 2003  (JP) .................................... 2003-130656

(51) Int. Cl.
  *G11C 16/04* (2006.01)

(52) U.S. Cl. ............................. 365/185.18; 365/185.05; 365/185.23

(58) Field of Classification Search ............ 365/185.18, 365/185.05, 185.23
See application file for complete search history.

(56) References Cited

U.S. PATENT DOCUMENTS

| 5,128,895 | A |   | 7/1992  | Park |
| 5,490,110 | A | * | 2/1996  | Sawada et al. ........ 365/185.03 |
| 5,563,842 | A | * | 10/1996 | Challa .................. 365/230.06 |
| 6,147,912 | A | * | 11/2000 | Kitazawa ............... 365/189.02 |

FOREIGN PATENT DOCUMENTS

JP  05-304277  11/1993

* cited by examiner

*Primary Examiner*—Son T. Dinh
(74) *Attorney, Agent, or Firm*—Morison & Foerster LLP

(57) ABSTRACT

A method for driving a semiconductor memory device includes a memory array having a plurality of memory cells arranged in rows and columns. Each memory cell includes a gate electrode formed on a semiconductor layer via a gate insulating film, a channel region disposed below the gate electrode, a source and a drain as diffusion regions disposed on both sides of the channel region and having a conductive type opposite to that of the channel region, and memory functional units formed on both sides of the gate electrode and having a function of retaining charges. The method includes the steps of: selecting a row line connected to the gate electrode of a memory cell to be selected; grounding a first column line connected to the source of the memory cell to be selected; and applying a first potential to a second column line and a second potential to a third column line at the same time.

20 Claims, 16 Drawing Sheets

SEMICONDUCTOR MEMORY DEVICE, METHOD FOR DRIVING THE SAME AND PORTABLE ELECTRONIC APPARATUS

CROSS-REFERENCE TO RELATED APPLICATION

This application is related to Japanese patent application No. 2003-130656 filed on May 8, 2003, whose priority is claimed under 35 USC § 119, the disclosure of which is incorporated by reference in its entirety.

BACKGROUND OF THE INVENTION

1. Field of the Invention

The present invention relates to a semiconductor memory device using a nonvolatile memory, a method for driving the semiconductor memory device and a portable electronic apparatus.

2. Description of the Related Art

Conventionally, a flash memory is typically used as a nonvolatile memory.

In a flash memory, as shown in FIG. 24, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby constructing a memory cell. A device isolation region 906 is formed around the memory cell (see, for example, Japanese Unexamined Patent Publication No. Hei 5-304277 (1993)).

The memory cell retains data according to a charge amount in the floating gate 902. In a memory cell array constructed by arranging memory cells, an operation of rewriting/reading a desired memory cell can be performed by selecting a specific word line and a specific bit line and applying a predetermined voltage.

In such a flash memory, when a charge amount in the floating gate changes, a drain current (Id)-gate voltage (Vg) characteristic as shown in FIG. 25 is displayed. When the amount of negative charges in the floating gate increases, the threshold increases, and an Id-Vg curve shifts substantially in parallel in the direction of increasing Vg.

In such a flash memory, however, it is necessary to dispose the insulating film 907 for separating the floating gate 902 and the word line 903 from the functional viewpoint. In addition, in order to prevent leakage of charges from the floating gate 902, it is difficult to reduce the thickness of the gate insulating film. It is therefore difficult to effectively reduce the thickness of the insulating film 907 and the gate insulating film, and it disturbs reduction in size of the memory cell.

SUMMARY OF THE INVENTION

The present invention has been achieved in consideration of the above mentioned problems and its object is to provide a semiconductor memory device including a nonvolatile memory cell which facilitates its microfabrication, a method for driving the semiconductor memory device, and a portable electronic apparatus.

The present invention provides a method for driving a semiconductor memory device comprising a memory array having a plurality of memory cells arranged in rows and columns, each memory cell includes a gate electrode formed on a semiconductor layer via a gate insulating film, a channel region disposed below the gate electrode, a source and a drain as diffusion regions disposed on both sides of the channel region and having a conductive type opposite to that of the channel region, and memory functional units formed on both sides of the gate electrode and having a function of retaining charges, the method comprising the steps of: selecting a row line connected to the gate electrode of the memory cell to be selected; grounding a first column line connected to the source of the memory cell to be selected; and applying a first potential to a second column line and a second potential to a third column line at the same time, wherein the second column line is connected to the drain of the memory cell to be selected and the third column line is connected to the drain of a memory cell adjacent to the memory cell to be selected while other row lines in the memory array are separated from the second and third column lines, and the first potential is applied by a first circuit, the second potential is applied by a second circuit, the first potential conditionally allows a reading current to flow via the memory cell to be selected, and a value of the current indicates the contents of the memory cell to be selected.

In the driving method according to the present invention, the first and second potentials may be substantially equal in value to each other.

The second circuit may have an output impedance lower than that of the first circuit.

The memory functional unit of the memory cell may include a film having a surface substantially parallel with a surface of the gate insulating film and having the function of retaining charges.

The memory cell may include a film having a surface substantially parallel with a surface of the gate insulating film and having the function of retaining charges; and an insulating film for separating the film from the channel region or the semiconductor layer, the insulating film having a thickness thinner than the gate insulating film and not less than 0.8 nm.

The semiconductor layer in the memory cell may have a region in the vicinity of the diffusion region, the region having a concentration higher than a portion in the vicinity of a surface of the semiconductor layer below the gate electrode.

At least a part of the memory functional unit of the memory cell may overlap a part of the diffusion region.

The present invention also provides a semiconductor memory device comprising: a memory array having a plurality of memory cells arranged in rows and columns, each of the memory cells including a gate electrode formed on a semiconductor layer via a gate insulating film, a channel region disposed below the gate electrode, first and second diffusion regions disposed on both sides of the channel region and having a conductive type opposite to that of the channel region, and memory functional units formed on both sides of the gate electrode and having a function of retaining charges; a plurality of row lines, in which the gate electrodes in all of the memory cells in the same row are connected to a common row line; first and second column lines, to which the first and second diffusion regions in all of the cells in the same column are connected, respectively; row decoding means for selecting a row line connected to a memory cell to be selected; and column decoding means for grounding a second column line connected to the memory cell to be selected and for connecting a first column line connected to the memory cell to be selected to a first potential applied from a first circuit, so as to conditionally allow a current to flow via the memory cell to be selected, thereby accessing the content of the memory cell to be selected, wherein the column decoding means connects another second column line connected to a memory cell adjacent to the memory cell to be selected to a second potential to be applied from a second circuit while all of other first and second column lines in the memory array are separated from the first and second potentials, so as to prevent any interference from the adjacent memory cell during an access period of the memory cell to be selected.

The first and second potentials may be substantially equal in value to each other, for protecting the selected cell from a parasitic current during a reading processing period.

The second circuit may have an output impedance lower than that of the first circuit.

The semiconductor memory device may further comprise a plurality of path gate transistors, which is connected between the adjacent first and second column lines to selectively de-bias the memory array during a writing period to avoid a trouble of adjacent cells.

The memory functional unit of the memory cell may include a film having a surface substantially parallel with a surface of the gate insulating film and having the function of retaining charges.

The memory cell may include a film having a surface substantially parallel with a surface of the gate insulating film and having the function of retaining charges; and an insulating film for separating the film from the channel region or the semiconductor layer, the insulating film having a thickness thinner than the gate insulating film and not less than 0.8 nm.

The semiconductor layer in the memory cell may have a region in the vicinity of the diffusion region, the region having a concentration higher than a portion in the vicinity of the surface of the semiconductor layer below the gate electrode.

At least a part of the memory functional unit of the memory cell may overlap a part of the diffusion region.

The present invention also provides a method for driving a semiconductor memory device comprising a plurality of memory cells arranged in rows and columns, each of the memory cells including a gate electrode formed on a semiconductor layer via a gate insulating film, a channel region disposed below the gate electrode, first and second diffusion regions disposed on both sides of the channel region and having a conductive type opposite to that of the channel region, and memory functional units formed on both sides of the gate electrode and having a function of retaining charges, and a plurality of row lines including first and second lines, in which the gate electrodes in all of the memory cells in the same row are connected to the same row line and first and second diffusion regions in all of the cells in the same column line are connected to the corresponding first and second column lines, respectively, the method comprising the steps of: applying a first potential to a row line connected to a memory cell to be selected, so as to connect all of the first and second column lines on one side of the memory cell to be selected to a first node; connecting all of the first and second column lines on the other side of the memory cell to be selected to a second node; grounding the first node; and increasing a potential of the second node up to a second potential at a predetermined speed, so as to tunnel electrons to the gate electrode of the memory cell to be selected, wherein the predetermined speed is controlled in such a manner as to prevent data stored in adjacent cells from being disturbed by a potential between the first and second column lines connected to the selected memory cell.

The predetermined speed may be 10 volt/$\mu$sec or less.

The first potential may be about 12 V.

The second potential may be about 7 V.

The memory functional unit of the memory cell may include a film having a surface substantially parallel with a surface of the gate insulating film and having the function of retaining charges.

The memory cell may include a film having a surface substantially parallel with a surface of the gate insulating film and having the function of retaining charges; and an insulating film for separating the film from the channel region or the semiconductor layer, the insulating film having a thickness thinner than the gate insulating film and not less than 0.8 nm.

The semiconductor layer in the memory cell may have a region in the vicinity of the diffusion region, the region having a concentration higher than a portion in the vicinity of a surface of the semiconductor layer below the gate electrode.

At least a part of the memory functional unit of the memory cell may overlap a part of the diffusion region.

DETAILED DESCRIPTION OF THE INVENTION

Figure 1:
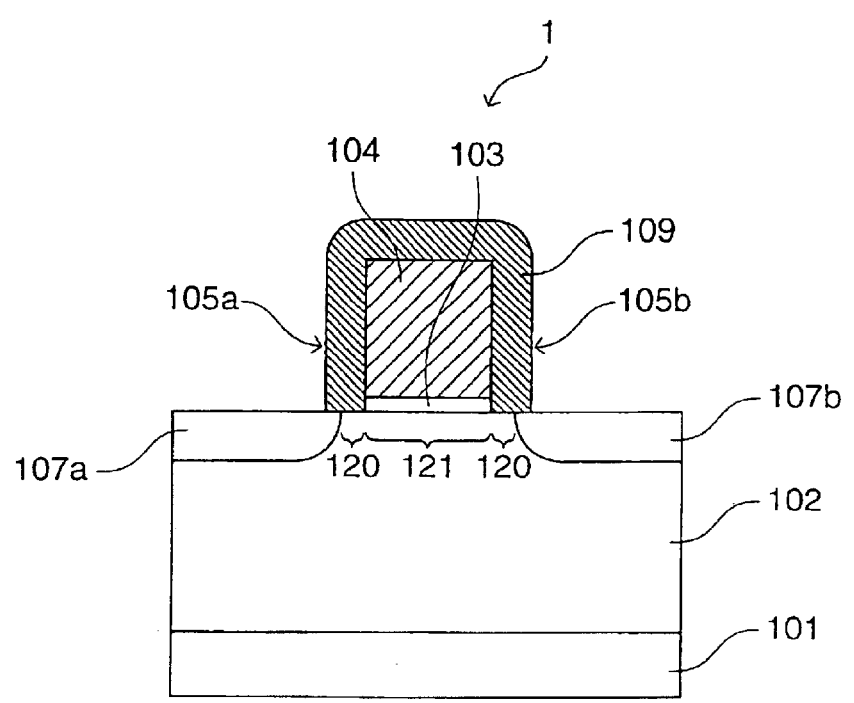
FIG. 1 is a schematic sectional view showing a main part of a memory cell (first embodiment) in a semiconductor memory device according to the present invention.

According to the present invention, the memory cell forming a memory array is mainly constructed by a semiconductor layer, a gate insulating film, a gate electrode, a channel region, a diffusion region and a memory functional unit. Herein, the channel region is normally a region of the same conductive type as that of the semiconductor layer and denotes a region immediately below the gate electrode. The diffusion region denotes a region of the conductive type opposite to that of the channel region.

Specifically, the memory cell in the present invention may be constructed by a region of a first conductive type as a diffusion region, a region of a second conductive type as a channel region, a memory functional unit disposed across a border of the regions of the first and second conductive types, and an electrode provided via a gate insulating film. It is suitable that the memory cell of the present invention is constructed by a gate electrode formed on a gate insulating film, two memory functional units formed on both sides of the gate electrode, two diffusion regions disposed on the opposite sides of the gate electrode of the memory functional units, and a channel region disposed below the gate electrode.

In the semiconductor device of the present invention, the semiconductor layer is formed on the semiconductor substrate, preferably, on a well region of the first conductive type formed in the semiconductor substrate.

The semiconductor substrate is not particularly limited as long as it can be used for a semiconductor device, and examples thereof include a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although an amount of current flowing therein varies a little.

Preferably, a device isolation region is formed on the semiconductor layer. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. At least one well region of the first conductive type (P or N type) is preferably formed in the semiconductor layer. As impurity concentration in the semiconductor layer and the well region, impurity concentration which is within a known range in this field can be used. In the case of using the SOI substrate as the semiconductor layer, the well region may be formed in the surface semiconductor layer and a body region may be provided below a channel region.

The gate insulating film is not particularly limited as long as it is usually used for a semiconductor device, and an example thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end portion on the gate insulating film. The gate electrode is preferably formed in an integral form without being separated by a single-layered or multilayer conductive film. The gate electrode may be disposed in a state where it is separated by a single-layered or multilayer conductive film. The gate electrode may have a side-wall insulating film on its sidewalls. Usually, the gate electrode is not particularly limited as long as it is used for a semiconductor device, and an example of thereof includes a conductive film such as a single-layered or multilayer film made of polysilicon, a metal such as copper or aluminum, a high-refractory metal such as tungsten, titanium or tantalum, and a silicide or the like with the high refractory metal. Suitable thickness of the gate electrode is, for example, about 50 to 400 nm. Below the gate electrode, a channel region is formed.

Preferably, the gate electrode is formed only on the sidewalls of the memory functional unit or does not cover the top part of the memory functional unit. By such arrangement, a contact plug can be disposed closer to the gate electrode, so that reduction in the size of the memory cell is facilitated. It is easy to manufacture the memory cell having such simple arrangement, so that the yield can be improved.

The memory functional unit has at least the function of retaining charges (hereinafter, described as "charge retaining function"). In other words, the memory functional unit has the function of accumulating and retaining charges, the function of trapping charges or the function of holding a charge polarization state. The function is exhibited, for example, when the memory functional unit includes a film or region having the charge retaining function. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

By using the insulating film including a film having the charge retaining function such as a silicon nitride film as the memory functional unit, reliability of storage and retention can be increased. Since the silicon nitride film is an insulator, even in the case where a charge leak occurs in part of the silicon nitride film, the charges in the whole silicon nitride film are not lost immediately. In the case of arranging a plurality of memory cells, even when the distance between the memory cells is shortened and neighboring memory cells come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

In order to increase the reliability of storage and retention, the film having the charge retaining function does not always have to have a film shape. Preferably, films having the charge retaining function exist discretely in an insulating film. Concretely, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternately, as a memory functional unit, a ferroelectric film such as PZT or PLZT in which the polarization direction changes according to the electric field may be used. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

As the insulating film constructing the memory functional unit, a film having a region or function of suppressing escape of charges is suitable. An example of a film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be appropriately adjusted in accordance with the performance or the like of a semiconductor memory device to be obtained. In the case of using an SOI substrate as a semiconductor substrate, the diffusion region may have a junction depth smaller than the thickness of the surface semiconductor layer. It is preferable that the diffusion region has junction depth substantially the same as that of the surface semiconductor layer.

The diffusion region may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the diffusion area closer to one of the gate electrode ends in the gate length direction is shorter than the thickness of the charge retaining film extending in the direction parallel with the gate length direction. It is particularly preferable that at least a part of the film or region having the charge retaining function in the memory functional unit is overlapped with part of the diffusion region. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the diffusion region.

A part of the diffusion region may extend at a level higher than the surface of the channel region or the under face of the gate insulating film. In this case, it is suitable that, on the diffusion region formed in the semiconductor substrate, the conductive film integrated with the diffusion region is laminated. The conductive film is made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode.

The memory cell of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode, after that, forming a single-layer film or laminated film including the charge retaining film such as a film having the function of retaining charges (hereinafter, described as "charge retaining film"), charge retaining film/insulating film, insulating film/ charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode is formed, charge retaining film, charge retaining film/insulating film, insulating film/charge retaining film, insulating film/charge retaining film/insulating film, or the like is formed. An opening is formed in a region which becomes the channel region of the films, a gate electrode material film is formed on the entire surface of the opening, and the gate electrode material film is patterned in a shape including the opening and larger than the opening.

One example of a method for forming the memory cell according to the present invention will now be described.

First, a gate insulating film and a gate electrode are formed on a semiconductor substrate in accordance with known procedures. Subsequently, a silicon oxide film having a thickness of 0.8 to 20 nm, more preferably 3 to 10 nm is formed by thermal oxidation or deposited by CVD (Chemical Vapor Deposition) over the entire semiconductor substrate. Next, a silicon nitride film having a thickness of 2 to 15 nm, more preferably 3 to 10 nm is deposited by the CVD over the entire silicon oxide film. Moreover, another silicon oxide film having a thickness of 20 to 70 nm is deposited by the CVD over the entire silicon nitride film.

Subsequently, the silicon oxide film/silicon nitride film/ silicon oxide film are etched back by anisotropic etching, thereby forming a memory functional unit optimum for storing data on the sidewall of the gate electrode in the form of a sidewall spacer.

Thereafter, ions are injected while using the gate electrode and the memory functional unit in the form of the sidewall spacer as masks, thereby forming a diffusion layer region (source/drain region). After that, a silicide process or an upper wiring process may be performed in accordance with known procedures.

In the case of constructing the memory cell array by arranging memory cells of the present invention, the best mode of the memory cell satisfies all of the requirements: for example, (1) the gate electrodes of a plurality of memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface substantially parallel with the surface of the gate insulating film; (5) a silicon nitride film in the memory functional unit is isolated from a word line and a channel region via a silicon oxide film; (6) the silicon nitride film and a diffusion region in the memory functional unit are overlapped; (7) the thickness of the insulating film separating the silicon nitride film having the surface which is substantially parallel with the surface of the gate insulating film from the channel region or semiconductor layer and the thickness of the gate insulating film are different from each other; (8) an operation of writing/erasing one memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. It is sufficient for the memory cell to satisfy even one of the requirements.

A particularly preferable combination of the requirements is, for example, (3) an insulator, particularly, a silicon nitride film retains charges in the memory functional unit, (6) the insulating film (silicon nitride film) and the diffusion region in the memory functional unit are overlapped, and (9) there is no electrode (word line) having the function of assisting the writing/erasing operation on the memory functional unit.

In the case where the memory cell satisfies the requirements (3) and (9), it is very useful for the following reasons. First, the bit line contact can be disposed closer to the memory functional unit on the word line sidewall or even when the distance between memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo etching process for isolating the memory functional unit becomes unnecessary, and the manufacturing process is simplified.

Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo etching process for isolating the memory functional unit for each memory cell is preferable, and a margin for positioning in the photolithography process and a margin for film reduction by etching are preferable.

Moreover, since the electrode having the function of assisting the writing and erasing operations does not exist on the memory functional unit and the device structure is simple, the number of processes decreases, so that the yield can be increased. Therefore, it facilitates formation with a transistor as a component of a logic circuit or an analog circuit, and a cheap semiconductor memory device can be obtained.

The present invention is more useful in the case where not only the requirements (3) and (9) but also the requirement (6) are satisfied.

Specifically, by overlapping the charge retaining region in the memory functional unit and the diffusion region, writing and erasing can be performed with a very low voltage. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed.

In the semiconductor memory device of the present invention, a transistor may be connected in series with one of or both sides of a memory cell, or the memory cell may be mounted on the same chip with a logic transistor. In such a case, the semiconductor device of the present invention, particularly, the memory cell can be formed by a process having high compatibility with a process of forming a normal standard transistor such as a transistor or a logic transistor, they can be formed simultaneously. Therefore, a process of forming both the memory cell and a transistor or a logic transistor is very simple and, as a result, a cheap embedded device can be obtained.

In the semiconductor memory device of the present invention, the memory cell can store information of two or more values in one memory functional unit. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional unit.

The semiconductor memory device of the present invention can be widely applied by being combined with a logic device, a logic circuit or the like to: a data processing system such as a personal computer, a note-sized computer, a laptop computer, a personal assistant/transmitter, a mini computer, a workstation, a main frame, a multiprocessor/computer, a computer system of any other type, or the like; an electronic part as a component of the data processing system, such as a CPU, a memory or a data memory device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card. Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device of the present invention may be provided as at least a part of a control circuit or a data storing circuit of an electronic device or, as necessary, detachably assembled.

DESCRIPTION OF THE PREFERRED EMBODIMENTS

Hereinafter, embodiments of the semiconductor memory device, the driving method therefor, and the portable electronic apparatus of the present invention will be described in detail with reference to the drawings.

First Embodiment

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
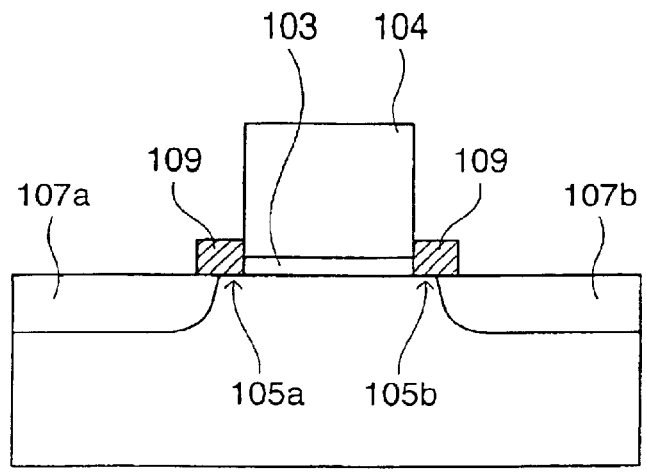
FIGS. 2A and 2B are schematic sectional views each showing a main part of a modification of the memory cell (first embodiment) in the semiconductor memory device according to the present invention.
Figure 2B:
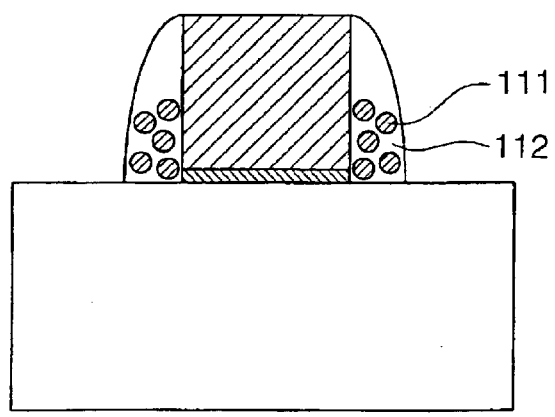

The memory functional units 105a and 105b for substantially retaining charges are the parts on both sidewalls of the gate electrode 104. It is therefore sufficient that the silicon nitride film 109 is formed only in regions corresponding to the parts (see FIG. 2A). Each of the memory functional units 105a and 105b may have a structure in which fine particles 111 each made of a conductor or semiconductor and having a nanometer size are distributed like discrete points in an insulating film 112 (see FIG. 2B). When the fine particle 111 has a size less than 1 nm, a quantum effect is too large, so that it becomes hard for charges to go through the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the memory cell will be described with reference to FIGS. 3 and 4. The case where whole memory functional units 131a and 131b have the function of retaining charges will be described. "Writing" denotes herein injection of electrons into the memory functional units 131a and 131b when the memory cell is of the N channel type. Hereinafter, on assumption that the memory cell is of the N channel type, description will be given.

Figure 3:
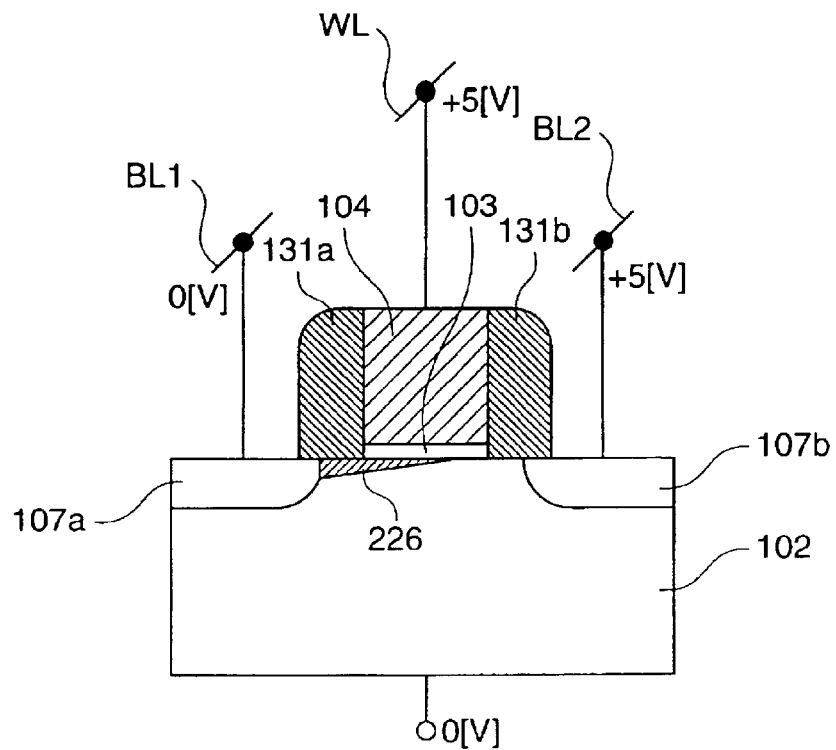
FIG. 3 is a diagram for describing a writing operation of the memory cell (first embodiment) in the semiconductor memory device according to the present invention.

In order to inject electrons (write) the second memory functional unit 131b, as shown in FIG. 3, the first diffusion region 107a of the N type is set as a source electrode, and the second diffusion region 107b of the N type is set as a drain electrode. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). By injection of the hot electrons into the second memory functional unit 131b, writing is performed. Since hot electrons are not generated in the vicinity of the first memory functional unit 131a, writing is not performed.

Figure 4:
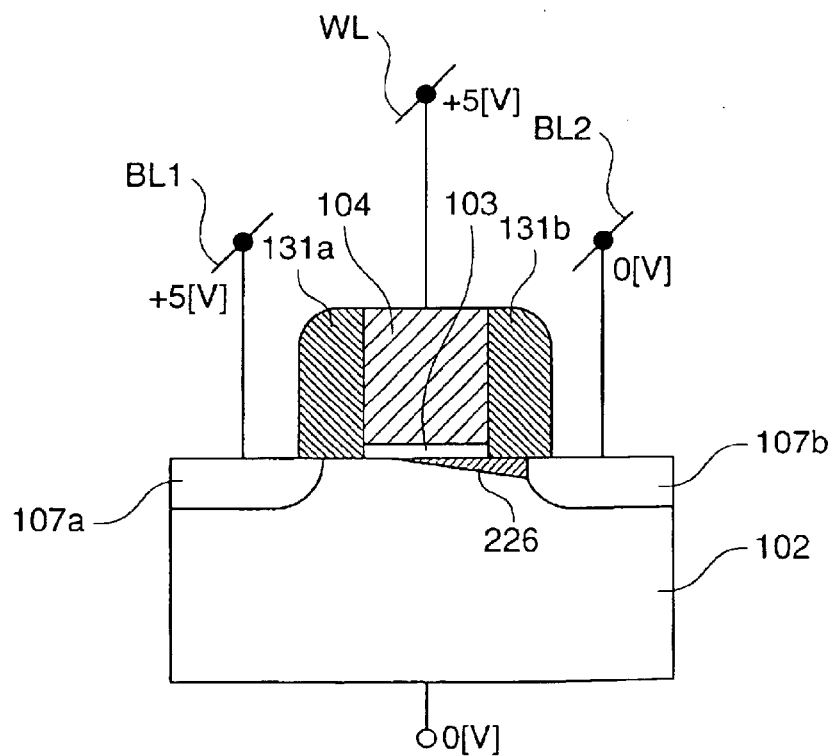
FIG. 4 is a diagram for describing a writing operation of the memory cell (first embodiment) in the semiconductor memory device according to the present invention.

On the other hand, in order to inject electrons (write) into the first memory functional unit 131a, as shown in FIG. 4, the second diffusion region 107a is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. By interchanging the source and drain regions so as to be different from the case of injecting electrons into the second memory functional unit 131b, electrons are injected into the first memory functional unit 131a and writing can be performed.

The principle of erasing operation of the memory cell will now be described with reference to FIGS. 5 and 6.

Figure 5:
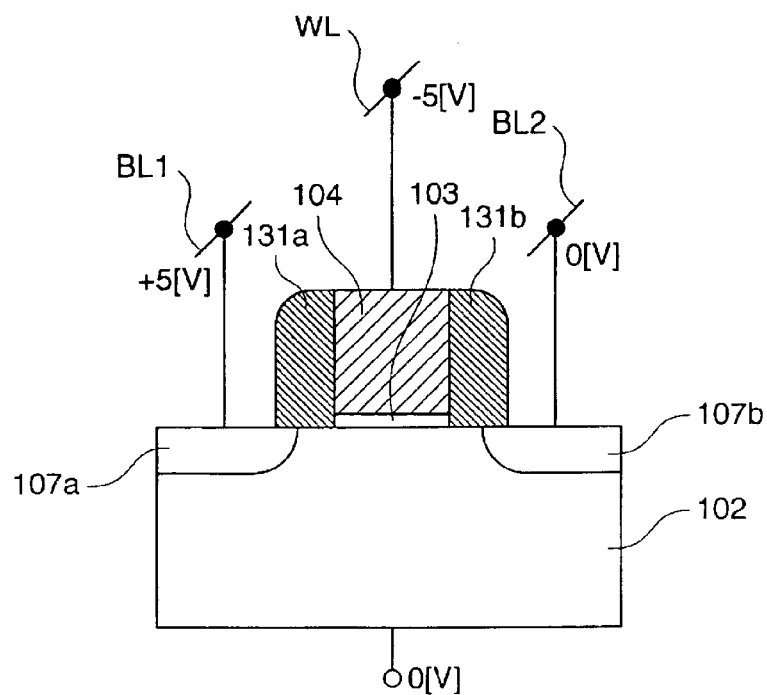
FIG. 5 is a diagram for describing an erasing operation of the memory cell (first embodiment) in the semiconductor memory device according to the present invention.

In a first method of erasing information stored in the first memory functional unit 131a, by applying positive voltage (for example, +5 V) to the first diffusion region 107a and applying 0 V to the P-type well region 102 as shown in FIG. 5, the PN junction between the first diffusion region 107a and the P-type well region 102 is reverse-biased and, further, negative voltage (for example, −5 V) is applied to the gate electrode 104. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
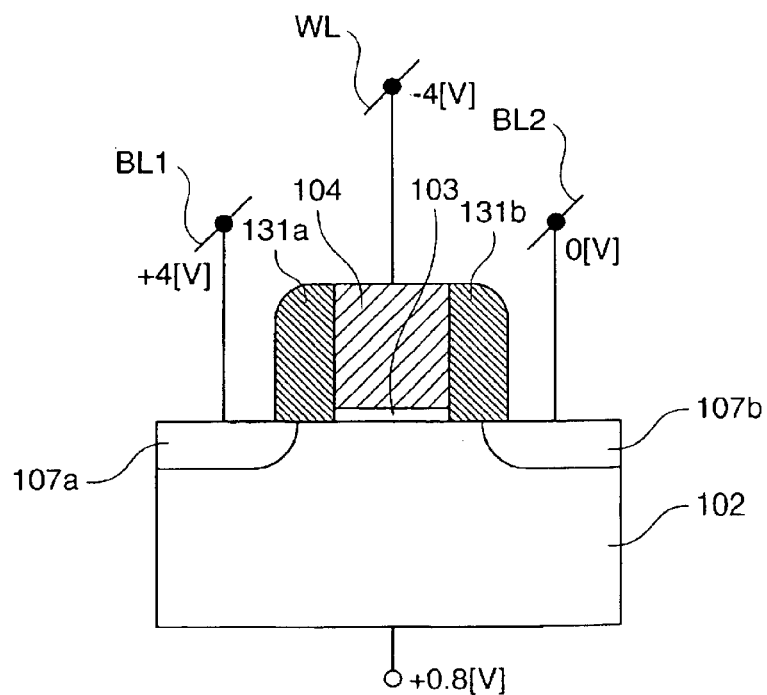
FIG. 6 is a diagram for describing an erasing operation of the memory cell (first embodiment) in the semiconductor memory device according to the present invention.

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, by applying forward voltage between the P-type well region 102 and the second diffusion region 107b, electrons injected in the P-type well region 102 become a trigger, and hot holes are generated in the PN junction positioned on the opposite side. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the gradient of potential in the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the memory cell due to hot carriers can be suppressed.

In any of the erasing methods, over-erasure does not occur easily in the memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

The memory cell includes a gate electrode formed on a semiconductor layer via a gate insulating film, a channel region disposed under the gate electrode, diffusion regions disposed on both sides of the channel region, and memory functional units formed on both sides of the gate electrode and having the function of retaining charges. The memory functional units are separated by the gate electrode from each other. It is therefore easy to reduce the thickness of the gate insulating film as compared with the conventional flash memory. As a result, it is possible to easily apply an electric field, which is stronger than conventional one, from the gate electrode to the PN junction, and to realize a high-speed erasing operation with low voltage.

In addition, it is desired that a charge retaining region in the memory functional unit overlaps with the diffusion region. By overlapping the diffusion region with the charge retaining region in the memory functional unit, hot holes are generated in a first erasing method and distance between the PN junction, in which an electron-hole couple is generated in a second erasing method, and the charge retaining region becomes shorter, so that it is possible to realize a high-speed erasing operation with low voltage.

Figure 7:
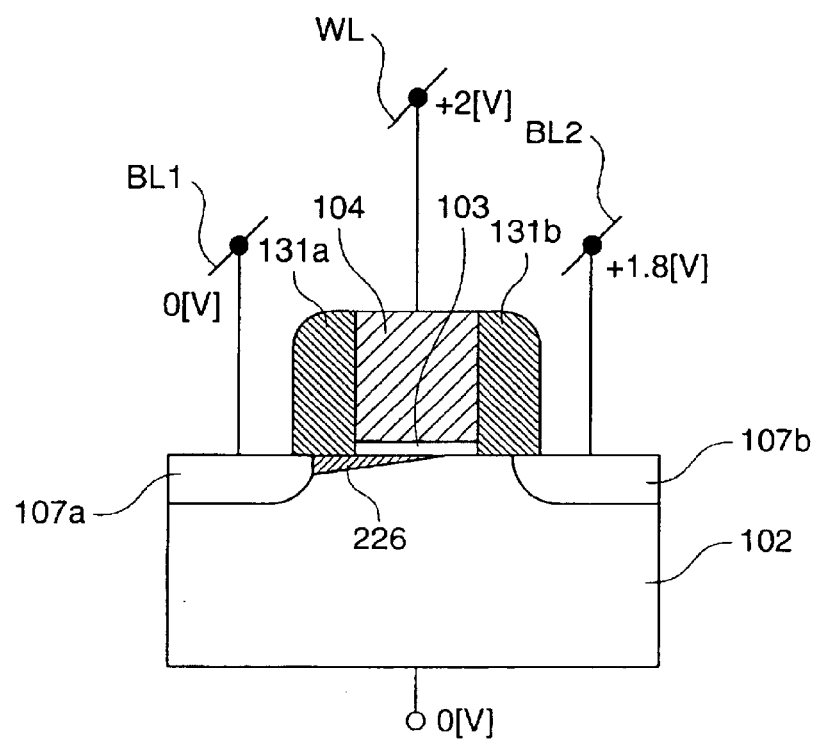
FIG. 7 is a diagram for describing a reading operation of the memory cell (first embodiment) in the semiconductor memory device according to the present invention.

Further, the principle of reading operation of the memory cell will be described with reference to FIG. 7.

In the case of reading information stored in the first memory functional unit 131a, the first diffusion region 107a is set as a source electrode, the second diffusion region 107b is set as a drain electrode, and the transistor is allowed to operate in a saturated region. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. In the case of applying a voltage so as to perform the pinch-off operation, thereby reading information, it is possible to determine with higher accuracy the state of charge accumulation in the first memory functional unit 131a without influence of the presence/absence of charge accumulation in the second memory functional unit 131b.

In the case of reading information stored in the second memory functional unit 131b, the second diffusion region 107b is set as a source electrode, the first diffusion region 107a is set as a drain electrode, and the transistor is operated. It is sufficient to apply, for example, 0 V to the second diffusion region 107b and the P-type well region 102, +1.8 V to the first diffusion region 107a, and +2 V to the gate electrode 104. By interchanging the source and drain regions of the case of reading information stored in the first memory functional unit 131a, information stored in the second memory functional unit 131b can be read.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be constructed.

In the above-described operating method, by interchanging the source electrode and the drain electrode, writing and erasing of two bits per one transistor are performed. Alternately, by fixing the source electrode and the drain electrode, the transistor may operate as a 1-bit memory. In this case, common fixed voltage can be applied to one of the source and drain regions, so that the number of bit lines connected to the source/drain regions can be reduced to the half.

As obvious from the above description, in the memory cell in the semiconductor memory device of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

Second Embodiment

Figure 8:
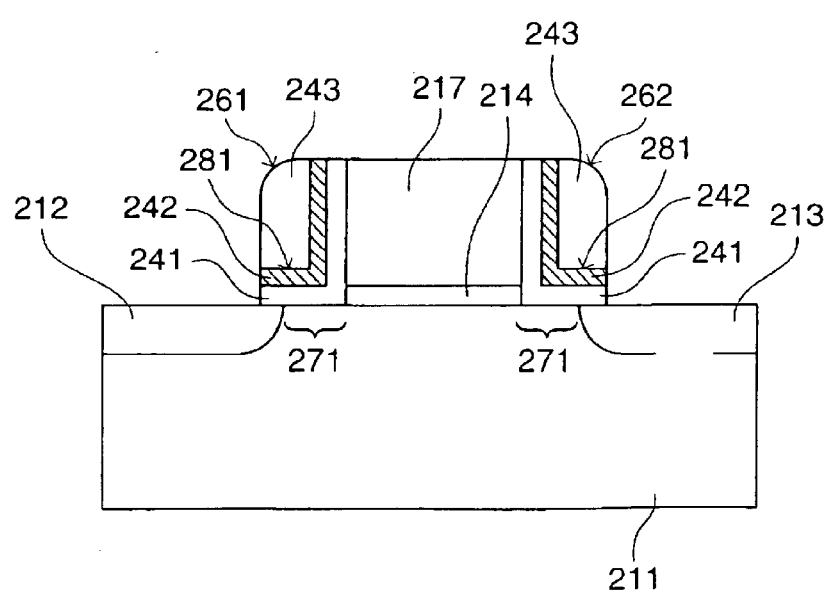
FIG. 8 is a schematic sectional view showing a main part of a memory cell (second embodiment) in the semiconductor memory device according to the present invention.

A memory cell in a semiconductor memory device according to a second embodiment has a configuration substantially similar to that of the memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. As compared with the case where the memory functional unit is constructed only by the charge retaining film, the volume of the charge retaining film can be appropriately reduced, movement of charges in the charge retaining film is regulated, and occurrence of a characteristic change due to charge movement during retention of information can be suppressed. Further, by employing the structure in which the silicon nitride film 242 is sandwiched by the silicon oxide films 241 and 243, charge injecting efficiency at the time of rewriting operation becomes high, so that higher-speed operation can be performed. In the memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
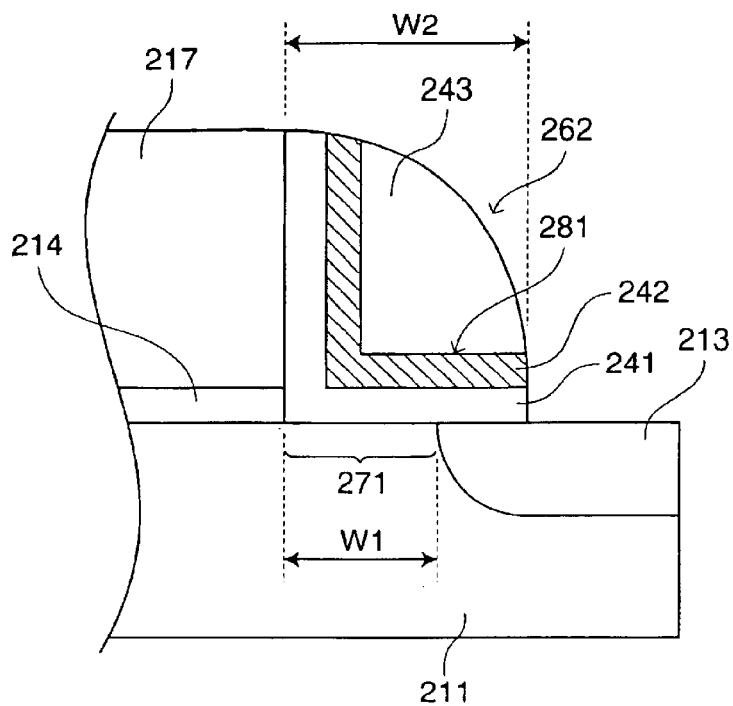
FIG. 9 is an enlarged schematic sectional view of the main part shown in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2−W1. It is important herein that the memory functional unit 262 constructed by the silicon oxide film 242 in the memory functional unit 262 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
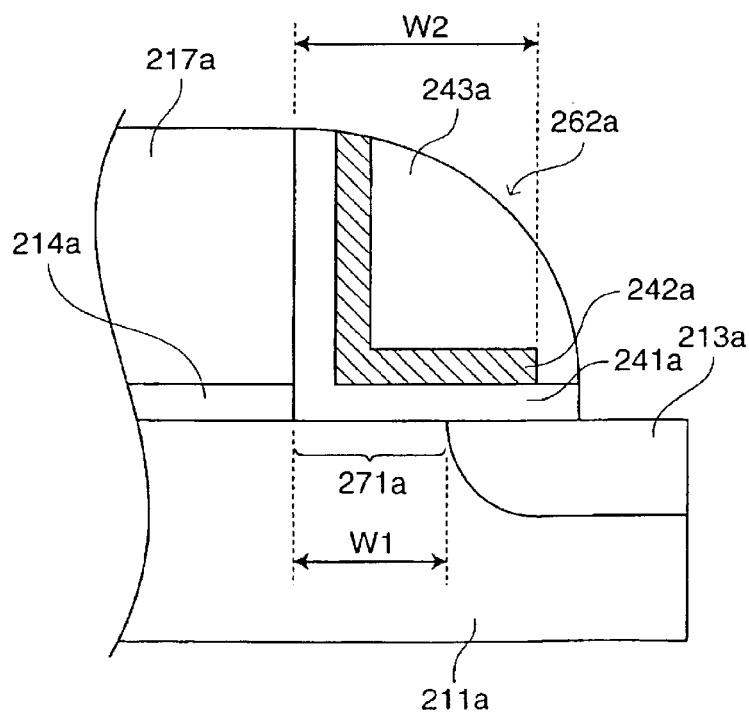
FIG. 10 is an enlarged schematic sectional view of a modification of the main part shown in FIG. 8.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
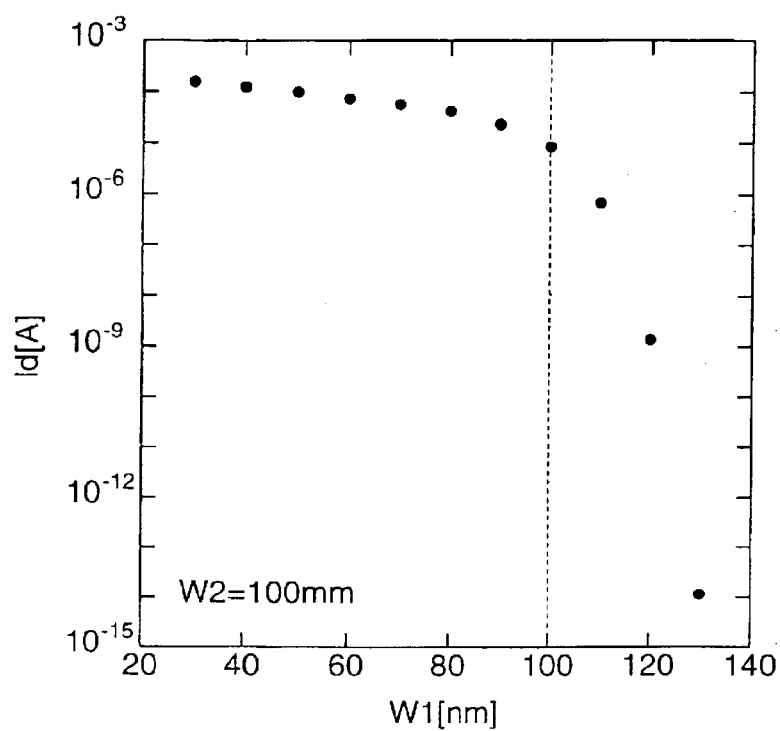
FIG. 11 is a graph showing electric characteristics of the memory cell (second embodiment) in the semiconductor memory device according to the present invention.

FIG. 11 shows drain current Id when the width W2 of the memory functional unit 262 is fixed to 100 nm and the offset amount W1 is changed in the structure of the memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is substantially proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, by fixing W2 to 100 nm and setting W1 to 60 nm and 100 nm as design values, memory cell arrays were produced. In the case where W1 is 60 nm, the silicon nitride film 242 and the diffusion regions 212 and 213 overlap with each other by 40 nm as a design value. In the case where W1 is 100 nm, there is no overlap as a design value. Reading time of the memory cell arrays was measured and worst cases considering variations were compared with each other. In the where W1 is set to 60 nm as a design value, read access time is 100 times as fast as that of the other case. In practice, the read access time is preferably 100 n/sec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

Figure 12:
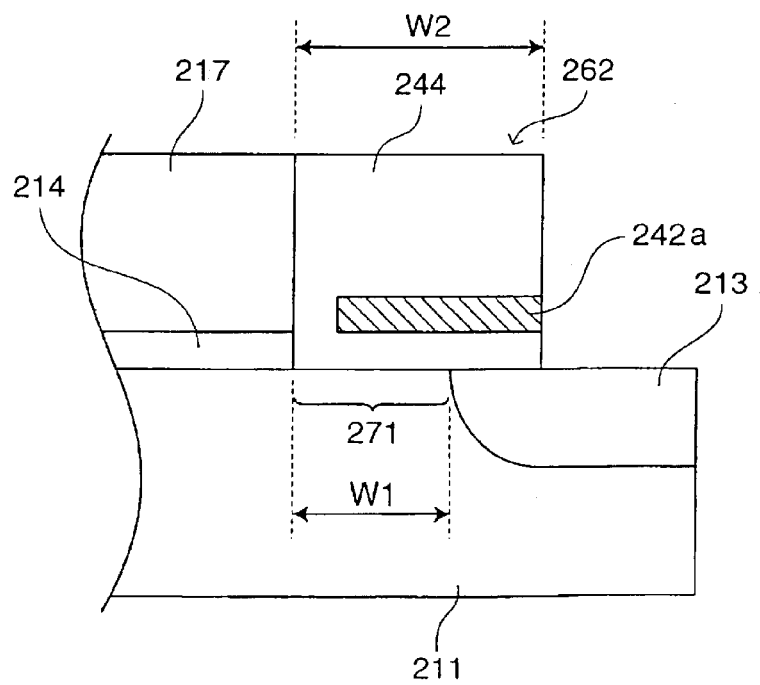
FIG. 12 is a schematic sectional view showing a main part of a modification of the memory cell (second embodiment) in the semiconductor memory device according to the present invention.

The memory functional unit preferably includes the charge retaining film disposed substantially in parallel with the gate insulating film surface. In other words, it is preferable that the level of the top face of the charge retaining film in the memory functional unit is positioned parallel to the level of the top face of the gate insulating film 214. Concretely, as shown in FIG. 12, the silicon nitride film 242a as a charge retaining film of the memory functional unit 262 has a surface substantially parallel with the surface of the gate insulating film 214. In other words, it is preferable that the silicon nitride film 242a is formed at a level parallel to the level corresponding to the surface of the gate insulating film 214.

By the existence of the silicon nitride film 242a substantially parallel to the surface of the gate insulating film 214 in the memory functional unit 262, formation easiness of the inversion layer in the offset region 271 can be effectively controlled in accordance with an amount of charges accumulated in the silicon nitride film 242a. Thus, the memory effect can be increased. By forming the silicon nitride film 242a substantially in parallel with the surface of the gate insulating film 214, even in the case where the offset amount (W1) varies, a change in the memory effect can be maintained relatively small, and variations of the memory effect can be suppressed. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is substantially parallel to the surface of the gate insulating film 214 and the channel region (or well region). By the insulating film, dissipation of the charges accumulated in the charge retaining film is suppressed and a memory cell having a better retention characteristic can be obtained.

By controlling the thickness of the silicon nitride film 242a and controlling the thickness of the insulating film below the silicon nitride film 242a (portion on the offset region 271 in the silicon oxide film 244) to be constant, the distance from the surface of the semiconductor substrate to charges accumulated in the charge retaining film can be maintained substantially constant. To be specific, the distance from the surface of the semiconductor substrate to the charges accumulated in the charge retaining film can be controlled in a range from the minimum thickness value of the insulating film under the silicon nitride film 242a to the sum of the maximum thickness value of the insulating film under the silicon nitride film 242a and the maximum thickness value of the silicon nitride film 242a. Consequently, density of electric lines of force generated by the charges accumulated in the silicon nitride film 242a can be substantially controlled, and variations in the memory effect of the memory cell can be reduced very much.

Third Embodiment

Figure 13:
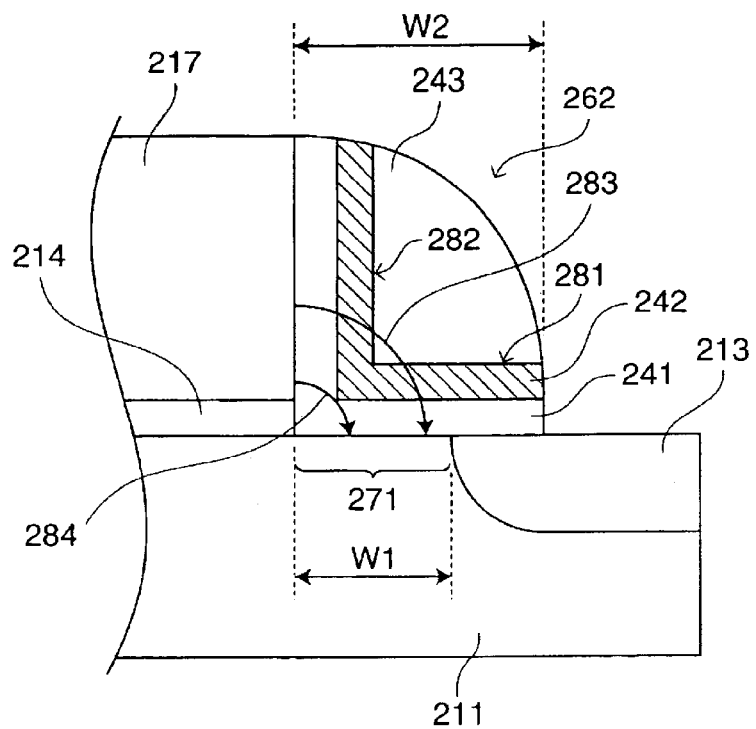
FIG. 13 is a schematic sectional view showing a main part of a memory cell (third embodiment) in the semiconductor memory device according to the present invention.

The memory functional unit 262 in a semiconductor memory device of a third embodiment has a shape in which the silicon nitride film 242 as a charge retaining film has substantially uniform thickness and is disposed substantially in parallel with the surface of the gate insulating film 214 as shown in FIG. 13 (region 281) and, further, substantially in parallel with a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, by including the charge retaining film shown by the arrow 282, charges injected into the memory functional unit 262 increase in the rewriting operation, and the rewriting speed increases.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film substantially parallel to the surface of the gate insulating film and the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode and the charge retaining film extended substantially parallel with the side face of the gate electrode. The insulating film prevents injection of charges from the gate electrode into the charge retaining film and accordingly prevents a change in the electric characteristics. Thus, the reliability of the memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be substantially controlled, and charge leak can be prevented.

Fourth Embodiment

In a fourth embodiment, optimization of the gate electrode, the memory functional unit, and the distance between the source and drain regions of a memory cell in a semiconductor memory device will be described.

Figure 14:
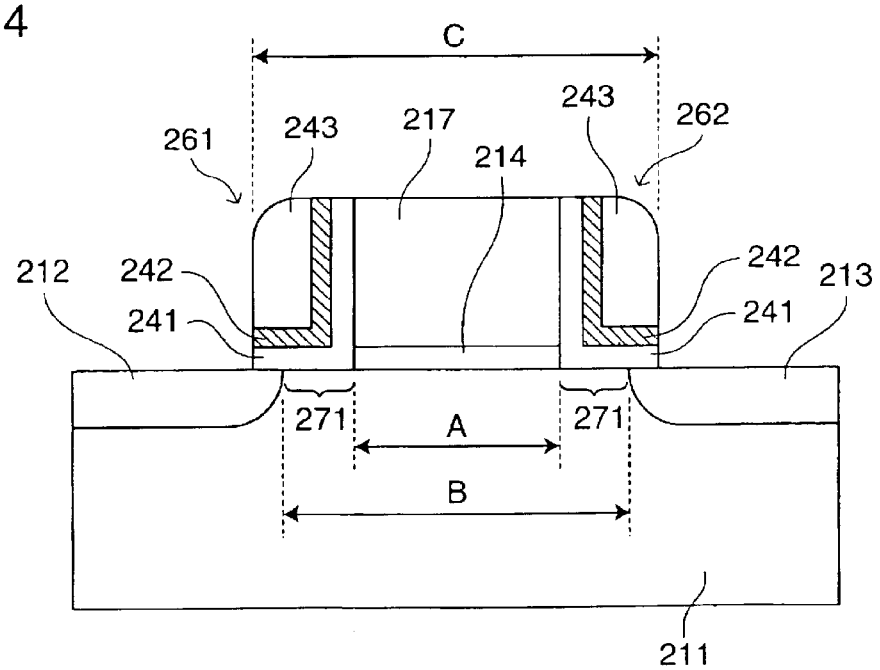
FIG. 14 is a schematic sectional view showing a main part of a memory cell (fourth embodiment) in the semiconductor memory device according to the present invention.

As shown in FIG. 14, a reference character A denotes length of the gate electrode in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
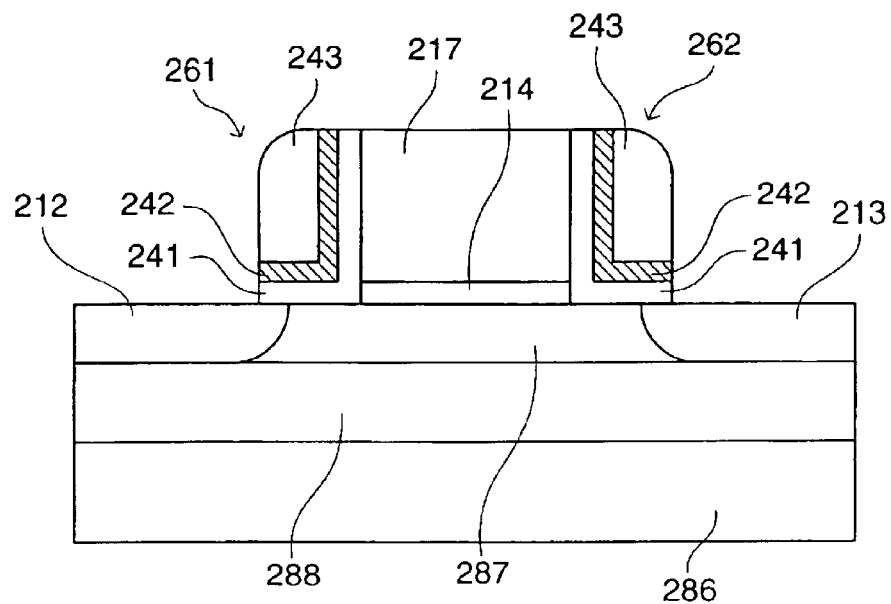
FIG. 15 is a schematic sectional view showing a main part of a memory cell (fifth embodiment) in the semiconductor memory device according to the present invention.

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the memory cell as well, action and effect similar to those of the memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
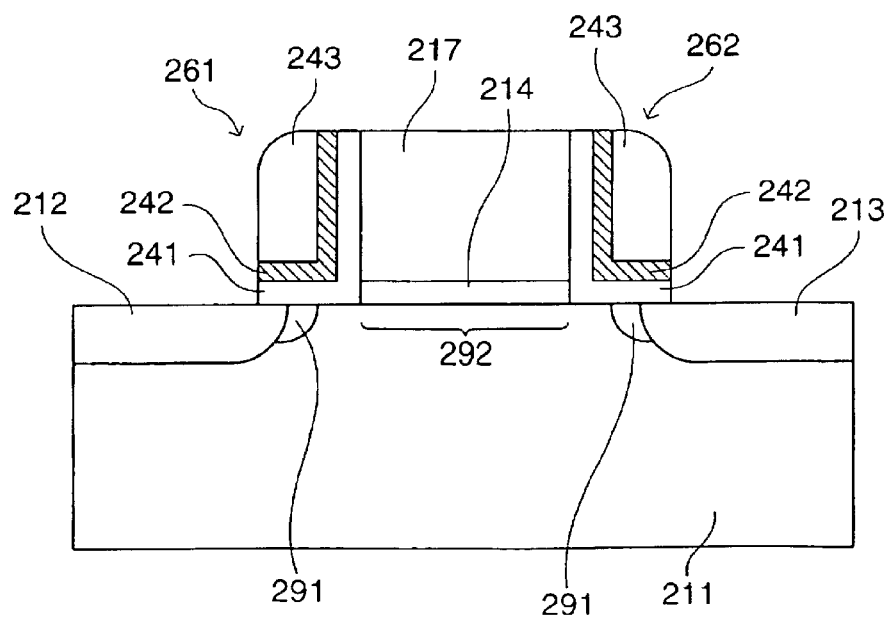
FIG. 16 is a schematic sectional view showing a main part of a memory cell (sixth embodiment) in the semiconductor memory device according to the present invention.

A memory cell in a semiconductor memory device in a sixth embodiment has, as shown in FIG. 16, a configuration substantially similar to that of the memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration int he P-type high-concetration region 291 is, for example, about $5\times10^{17}$ to $1\times10^{19}$ cm$^{-3}$. The P-type impurity concentration of the region 292 can be set to, for example, $5\times10^{16}$ to $1\times10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the memory cell with low rewriting voltage or high rewriting speed and high reading speed can be obtained.

In FIG. 16, by providing the P-type high-concentration region 291 in the vicinity of the source/drain regions and below the memory functional unit (that is, not immediately below the gate electrode), the threshold of the whole transistor remarkably increases. The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, by disposing the P-type high-concentration region 291 under the memory functional unit and in the vicinity of the source/drain regions, only the threshold in the writing operation largely fluctuates, and the memory effect (the difference between the threshold in the writing operation and that in the erasing operation) can be remarkably increased.

Seventh Embodiment

Figure 17:
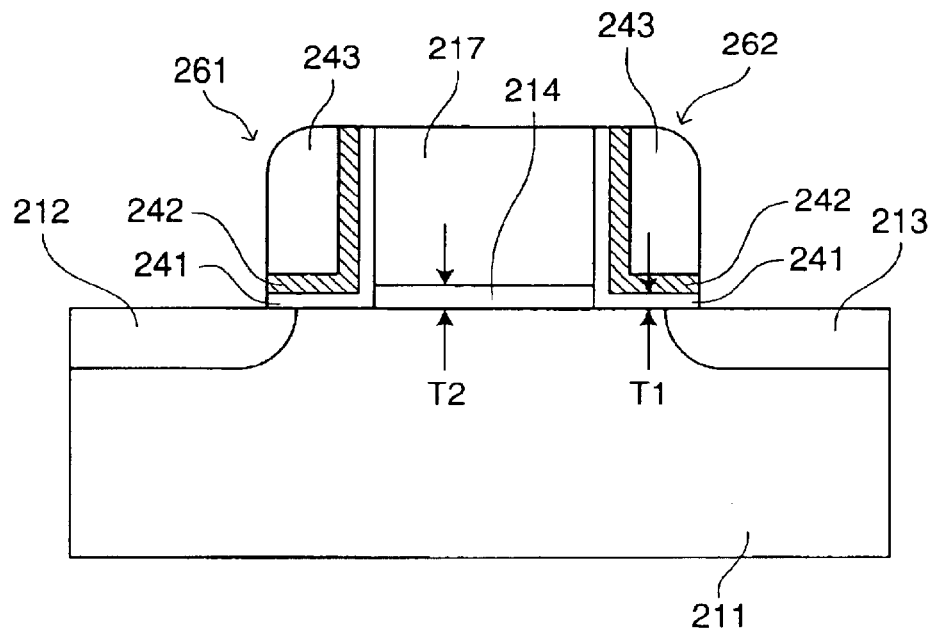
FIG. 17 is a schematic sectional view showing a main part of a memory cell (seventh embodiment) in the semiconductor memory device according to the present invention.

A memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) and the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller than T2 irrespective of the demand of withstand voltage.

The flexibility of designing with respect to T1 is high in the memory cell for the following reason.

In the memory cell, the insulating film for separating the charge retaining film and the channel region or well region is not sandwiched by the gate electrode and the channel region or well region. Consequently, to the insulating film for separating the charge retaining film and the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) and the channel region or well region, so that a high electric field from the gate electrode directly acts. Therefore, in an EEPROM, the thickness of the insulating film separating the floating gate and the channel region or well region is regulated, and optimization of the function of the memory cell is inhibited.

As obvious from the above, by setting T1<T2, without deteriorating the withstand voltage performance of the memory, the voltage of the writing and erasing operations is decreased, or the writing operation and erasing operation are performed at high speed and, further, the memory effect can be increased. More preferably, the thickness T1 of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a design rule, to drive the liquid crystal panel TFT, voltage of 15 to 18 V at the maximum is required, so that the gate oxide film cannot be thinned normally. In the case of mounting a nonvolatile memory for image adjustment on the liquid crystal driver LSI, in the memory cell of the present invention, the thickness of the insulating film separating the charge retaining film (silicon nitride film 242) and the channel region or well region can be designed optimally independently of the thickness of the gate insulating film. For example, the thickness can be individually set as T1=20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
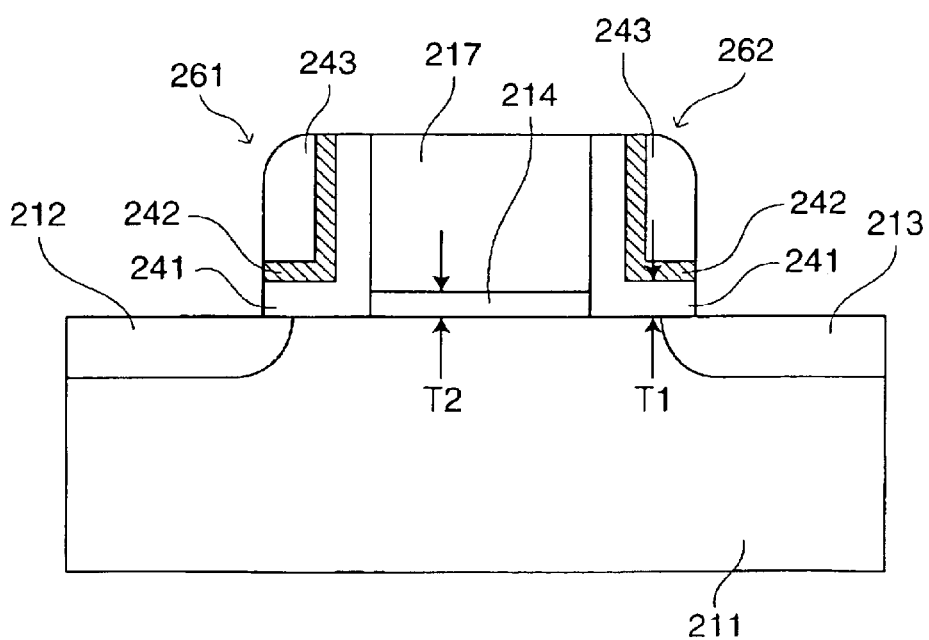
FIG. 18 is a schematic sectional view showing a main part of a memory cell (eighth embodiment) in the semiconductor memory device according to the present invention.

A memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) and the channel region or well region is larger than the thickness (T2) of the gate insulating film.

The thickness T2 of the gate insulating film 214 has an upper limit value due to demand of preventing a short channel effect of the device. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) and the channel region or well region can be designed optimally independent of the gate insulating film thickness. Thus, an effect that the memory functional unit does not disturb scaling is obtained.

The reason why flexibility of designing T1 is high in the memory cell is that, as described already, the insulating film separating the charge retaining film and the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate and the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film and the channel region or well region, but only a relatively low electric field which spreads in the horizontal direction from the gate electrode acts. Consequently, the memory cell having a gate length which is reduced to be equal to or less than the gate length of a logic transistor of the same process generation can be realized.

Ninth Embodiment

A ninth embodiment relates to a change in the electric characteristic at the time of rewriting a memory cell of a semiconductor memory device.

Figure 19:
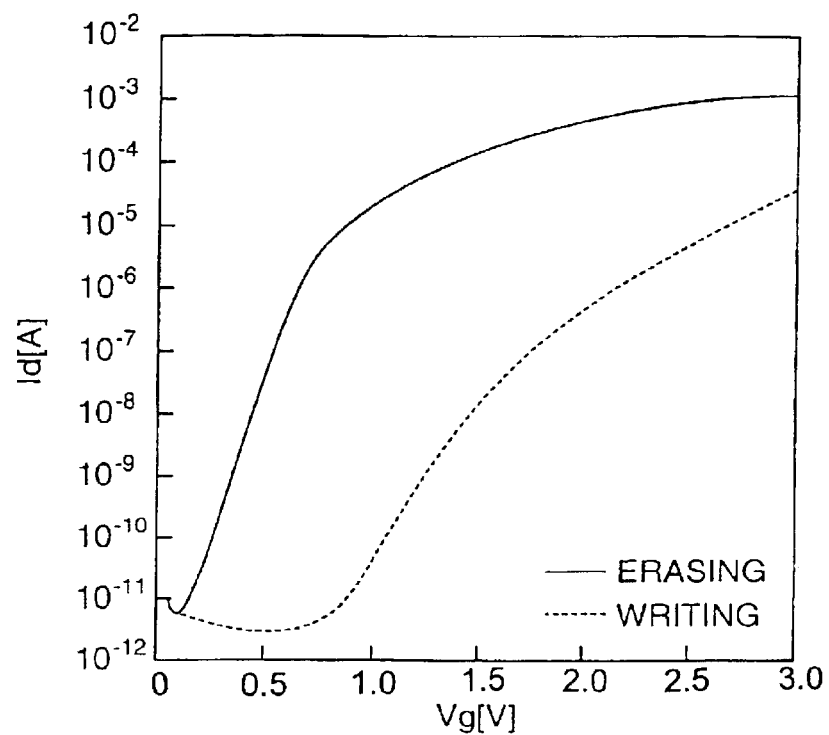
FIG. 19 is a graph showing electric characteristics of a memory cell (ninth embodiment) in the semiconductor memory device according to the present invention.

In an N-channel type memory cell, when an amount of charges in a memory functional unit changes, a drain current (Id)-gate voltage (Vg) characteristic (actual measurement value) as shown in FIG. 19 is exhibited.

Figure 25:
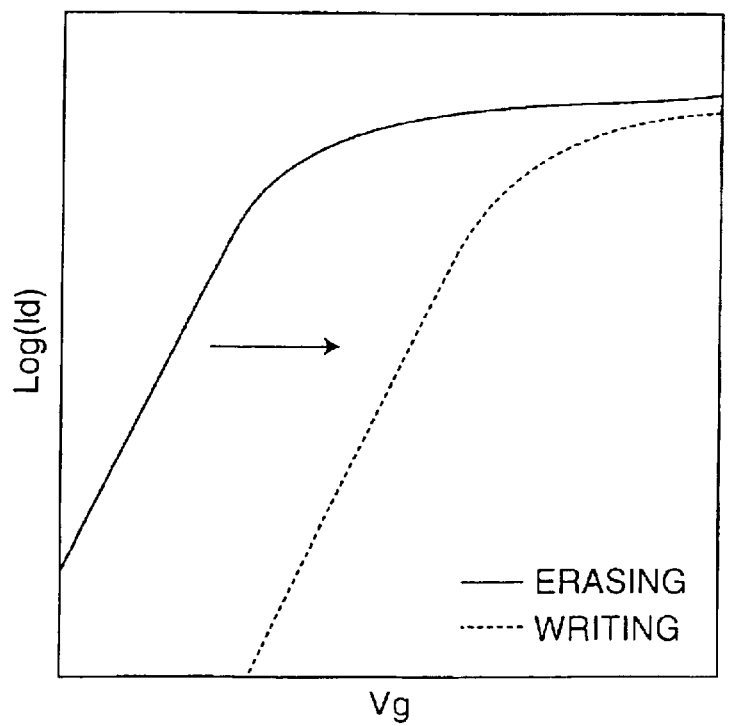
FIG. 25 is a graph showing electric characteristics of a conventional flash memory.

As obvious from FIG. 19, in the case of performing a writing operation in an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 25).

Appearance of such a characteristic is a peculiar phenomenon which occurs since the gate electrode and the diffusion region are offset from each other, and the gate electric field does not easily reach the offset region. When the memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As obviously understood from the above, in the memory cell in the semiconductor memory device of the present invention, the drain current ratio between the writing operation and the erasing operation can be particularly made high.

Tenth Embodiment

A tenth embodiment relates to a semiconductor memory device and a method for driving the semiconductor memory device, in which a memory array is configured by arranging the plurality of memory cells described in the first to ninth embodiments and a drive circuit for the memory array is additionally provided.

Specifically, a memory cell in the memory array in this embodiment includes a gate electrode formed on a semiconductor layer via a gate insulating film, a channel region disposed below the gate electrode, diffusion regions disposed on both sides of the channel region and having a conductive type opposite to that of the channel region, and memory functional units formed on both sides of the gate electrode and having a function of retaining charges.

Figure 20:
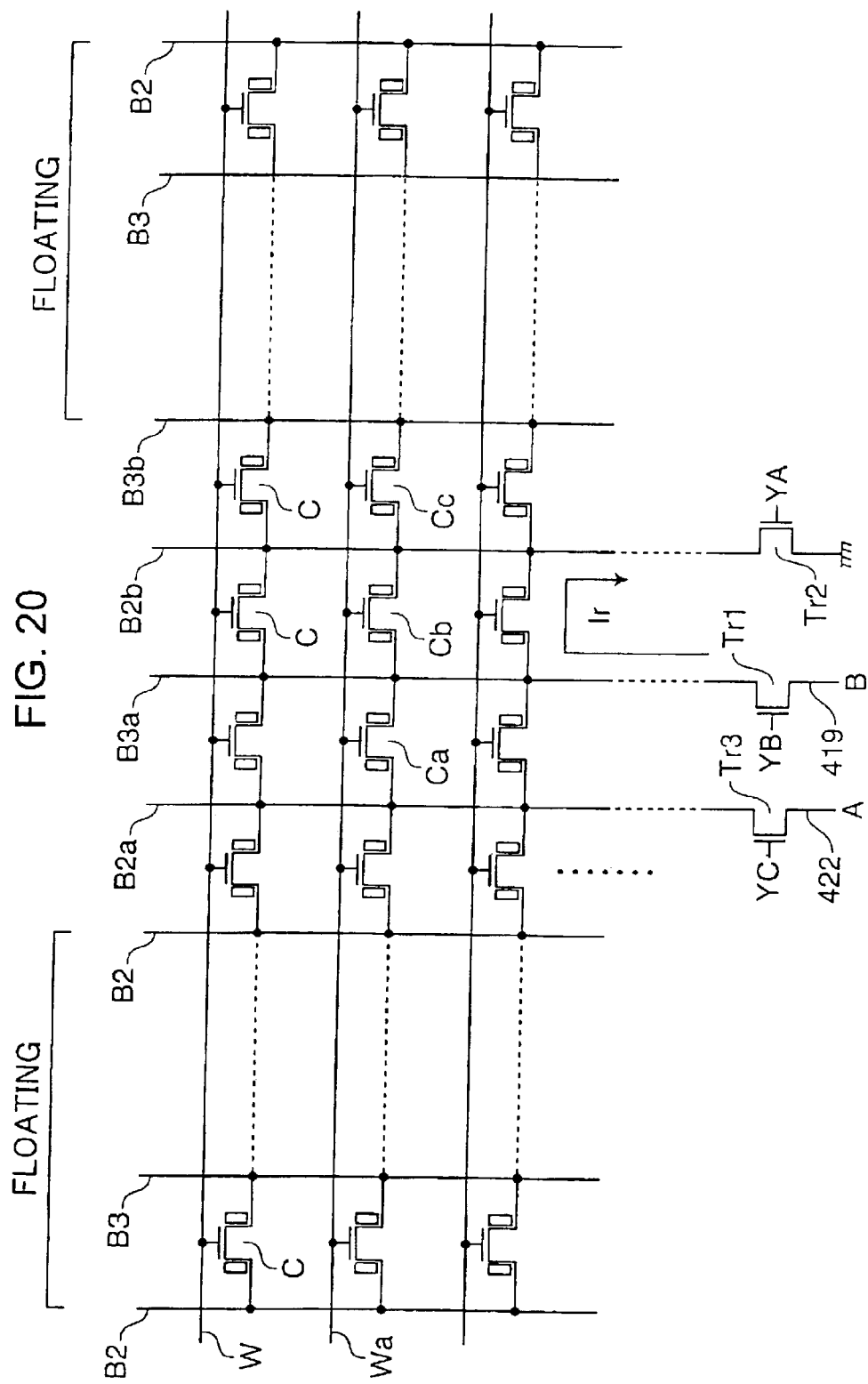
FIG. 20 is a circuit diagram showing a main part of a semiconductor memory device (tenth embodiment) according to the present invention.

A memory array shown in FIG. 20 includes memory cells C consisting of a row array and a column array. A gate of the memory cell C in one row is connected to a row line W. A source of the memory cell C in one column is connected to a bit line B2, and its drain is connected to a bit line B3.

In order to read the content of a cell Cb, the cell is first selected by setting a word line Wa at a high positive potential. At the same time, a source line B2b is grounded via a transistor Tr2. Another bit line right to the cell Cb (for example, a bit line B3b) is turned into a floating state. A row line B3a is connected to a read/drain bias potential, which is applied to a node B, via a transistor Tr1. An adjacent column line B2a is connected not to the same potential as that of the node B but to another read/drain bias potential, which is applied to a node A, in the method shown in FIG. 20. The node A is connected to the adjacent bit line B2a via a transistor Tr3. All of other bit lines left to the column B2a remain floating.

The read/drain bias potential applied to the node A is equal in value to the potential to be applied to the node B, for example, 1.2 V. A reading current all can be secured to flow via the cell Cb without bypassing the cell Ca by applying the potentials of the same value. Consequently, a value of a current Ir precisely corresponds to the content of the cell Cb. In other word, a circuit for applying the potential to the node A is different from a circuit for applying the potential to the node B.

Figure 21:
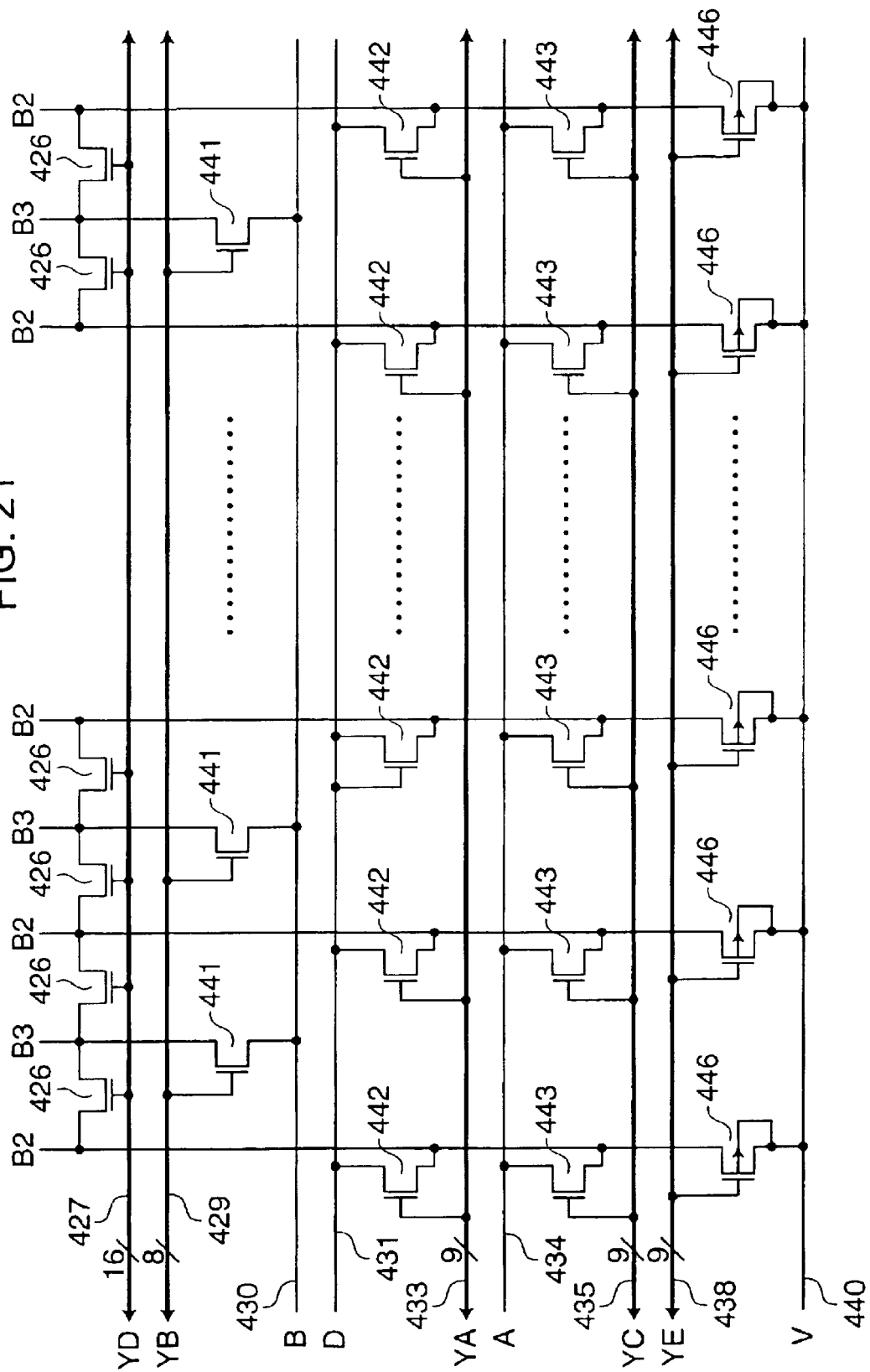
FIG. 21 is a circuit diagram showing a main part of the semiconductor memory device (tenth embodiment) according to the present invention.

A Y decoder circuit in this embodiment shown in FIG. 21 has source bit lines B2 and drain bit lines B3, across which a transistor 426 is connected. A gate of each of the transistors 426 is connected to a signal line YD along a line 427. The lines B2 and B3, of course, include the column line in the memory array shown in FIG. 20. The transistor 426 includes an inside column path gate transistor, for separating various column lines during a variety of writing processing periods. The function of the transistor 426 will be described later.

Each of the drain bit lines B3 is ended at a source of a transistor 441. A drain of the transistor 441 is connected to a read/drain bias voltage B along a line 430. A gate of each of the transistors 441 is connected to a bus 429 (represented by reference character YB). The decoder shown in FIG. 21 contains an array of 8 lines therein. The bus 429 has 8 bits, each of which is connected to the gate of each of the transistors 441. During a reading processing period, each of the lines of the bus 429 is actuated; thus, the selected drain line B3 is connected to the B potential.

In the same manner, each of the source lines B2 is connected to one terminal of a transistor 442, the other terminal of which is connected to a source/read bias line (represented by reference character D). A gate of each of the transistors 442 is connected to a bus 433 (represented by reference character YA). Normally, the line D is connected to a ground potential during the reading period, and then, a proper line YA is increased in potential, so that the selected source line B2 is grounded via the transistor 442. A second read/drain bias voltage A is provided along a line 434 shown in FIG. 21, and is connected to a source of a transistor 443. A drain of each of the transistors 443 is connected to each of the source bit lines B2. A gate of the transistor 443 is connected along a selection line bus 435 (represented by reference character YC). When the contents of the memory cell are read, the selection lines YA and YB allow the source and drain bit lines to be connected to the ground potential and the B potential, respectively. One line of the YC bus is used for selecting the source column line, which is located immediately next to the drain line connected to the B potential at this time. The selected source column line is connected to the potential A on the line 434. As described above, the potentials A and B are supplied via the different nodes by the different circuits, respectively, although they are equal in value to each other.

The source column line B2 supplies a potential V to a line 440 via each of P-channel field effect transistors 446. An n-well of each of the P-channel field effect transistors 446 also is connected to the potential V along the line 440. A gate of each of the transistors 446 is connected along a bus 438 (represented by reference character YE). The transistor 446 is provided for erasing process; therefore, the contents of all of the memory arrays can be erased at the same time. For example, in order to erase the contents of the memory array shown in FIG. 21, the potential V is connected to each of the column lines B2 by grounding the gate of the transistor 446. Simultaneously, all of the word lines W (see FIG. 20) in the array are grounded. As a result, the contents of all of the arrays are erased. Of course, there are many other methods for erasing the memory cells in the array.

During a writing period in the memory cell, the source is grounded, and further, a writing voltage is applied to the drain within a range of 4 V to 10 V and to the gate within a range of 3 V to 9 V. Herein, it is supposed to apply 5 V to the drain and 5 V to the gate. A writing voltage is applied, so that thermoelectrons are generated in a high electric field. The thermoelectrons adhere to the memory functional unit (i.e., the sidewall) at the cell. The term of "a writing trouble" signifies that writing is performed with respect to the adjacent cell along the same line to a similar extent, although not intended. For example, if the potential of the word line on a given row is increased up to a writing potential of 5 V, the potential of a gate of a cell immediately adjacent to a selected cell (i.e., a cell to be read) also becomes 5 V. The adjacent cell also shares the drain line whose potential is increased up to about 5 V, so that there is a possibility of generation of a high electric field over the channel of the adjacent cell. As a consequence, the writing is parasitically performed with respect to the adjacent memory cell. If the source and drain lines of the adjacent cell can be held at substantially the same potential, it is possible to definitely avoid the parasitic writing. In order to avoid a writing trouble with respect to the adjacent cell on the same row line as the selected cell, a de-bias mechanism incorporating the inside column path gate having a slowly inclined selection column voltage is used in this embodiment.

As shown in FIG. 21, each of the plurality of n-channel field effect transistors 426 has a gate connected to the 16-bit bus 427 (represented by reference character YD). Each of the transistors 426 is connected between the source bit line B2 and the drain bit line B3. During the writing period of the selected cell (for example, the cell Cb) in the column array, the source line B2 is first grounded via the transistor Tr2 (see FIG. 20). All of the column lines of the other sources and drains on the other side of that array (that is, the line B3$b$ and the like in FIG. 20) also are grounded by increasing the potential of the gate of the transistor 426 right to the selected cell. Consequently, the ground potential connected to the source bit line B2 is transmitted to the other column line in the array.

A similar approach is adopted to de-bias all of the column lines left to the selected memory cell. That is to say, the writing potential connected to the drain column line B3$a$ is transmitted to all of the column lines left to the selected memory cell via the transistors 426 by increasing the potential of the gate of the transistor 426 left to the selected cell to a high value.

In other words, when the writing is carried out with respect to the selected memory cell, all of the column lines on the side of the source of the selected cell are grounded while all of the column lines on the side of the drain of the selected cell are connected to a writing voltage of about 5 V. The de-biasing in this manner can effectively prevent any generation of the high electric field over the adjacent cell. As described above, not-intended writing is readily carried out at the cell by the high electric field between the source/drain terminals of the adjacent cell.

It is necessary to recognize that each of the transistors 426 has a given resistance incidental to the channel region and each of the column lines has an incidental capacitance. As a result, if the writing potential applied to the drain column line B3 is increased very fast (that is, at a high rising speed), there is produced a marked difference in voltage. It is supposed what happens when the line B3$a$ shown in FIG. 20 abruptly rises up to a writing voltage of 5 V. The potential of the adjacent column line B2$a$ is delayed in comparison with that of the line B3$a$ due to the respective resistances and capacitances incidental to the transistor 426 and the column lines B2 and B3. Consequently, a signal path has characteristics of a standard transmission bus.

The propagation delay of the writing potential causes an inclination of a voltage between the adjacent column lines B3$a$ and B2$a$. If the difference in potential is sufficiently large, the writing is carried out with respect to the adjacent cell Ca. Ideally, the difference in potential between the two column lines connected to a not-selected cell must be zero, and at least, it must become smaller than a predetermined limit. The limit signifies a largest electric field strength which can be allowed before the writing is carried out. In order to maintain the difference in potential smaller than the allowable limit, a writing potential to be applied to the drain bias line B3 is increased at a controlled speed. An inclination speed of about 10 volt/$\mu$sec or less is suitable for avoiding the writing trouble. If the speed is lower than that value, the voltages of the connected column lines rise up substantially at the same time. That is to say, if the speed is lower than 10 volt/$\mu$sec, a difference in potential generated between any two adjacent column lines is insufficient for parasitically performing the writing in the memory cell. It is understood that the transistor 426 should be optionally eliminated when the parasitic writing is ignored or the speed is not critical.

Eleventh Embodiment

Figure 22:
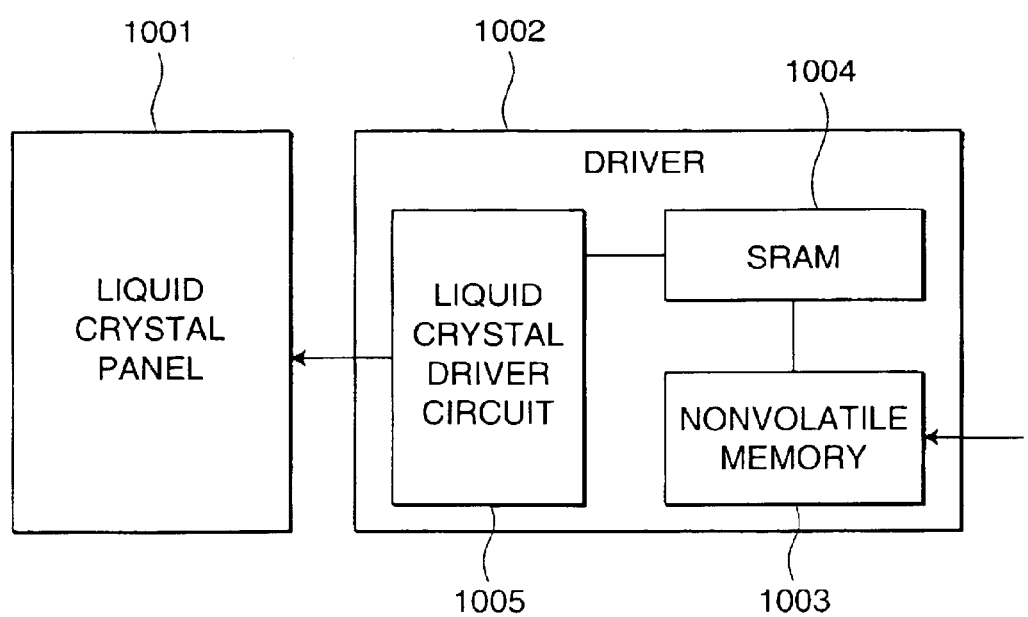
FIG. 22 is a schematic configuration diagram showing a liquid crystal display device (eleventh embodiment) in which the semiconductor memory device according to the present invention is assembled.

As an application example of the semiconductor memory device, for example, as shown in FIG. 22, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004 and a liquid crystal driver circuit 1005 are provided. The nonvolatile memory 1003 is constructed by the memory cell of the present invention, more preferably, any of the semiconductor memory devices of the first to ninth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 22 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mound a rewritable nonvolatile memory for storing correction information. As the nonvolatile memory, it is preferable to use the memory cell of the present invention. Particularly, it is preferable to use any of the semiconductor memory devices of the first to ninth embodiments in which memory cells of the present invention are integrated.

Twelfth Embodiment

Figure 23:
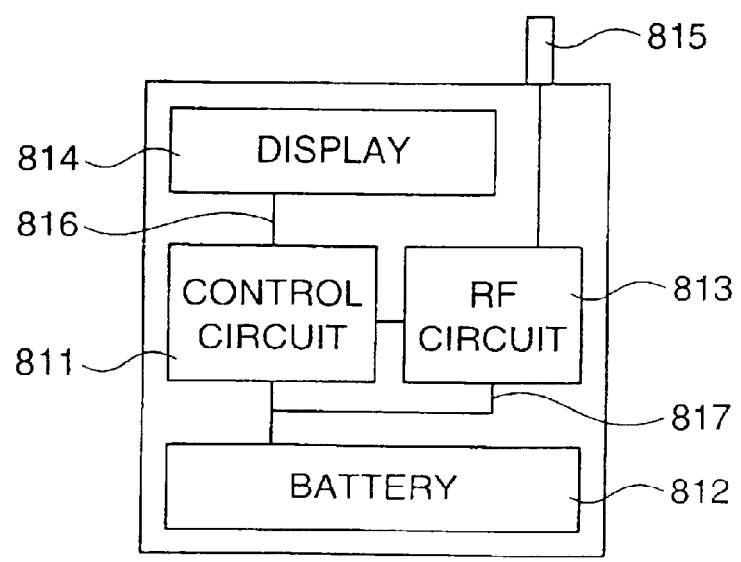
FIG. 23 is a schematic configuration diagram showing a portable electronic apparatus (twelfth embodiment) in which the semiconductor memory device according to the present invention is assembled.
Figure 24:
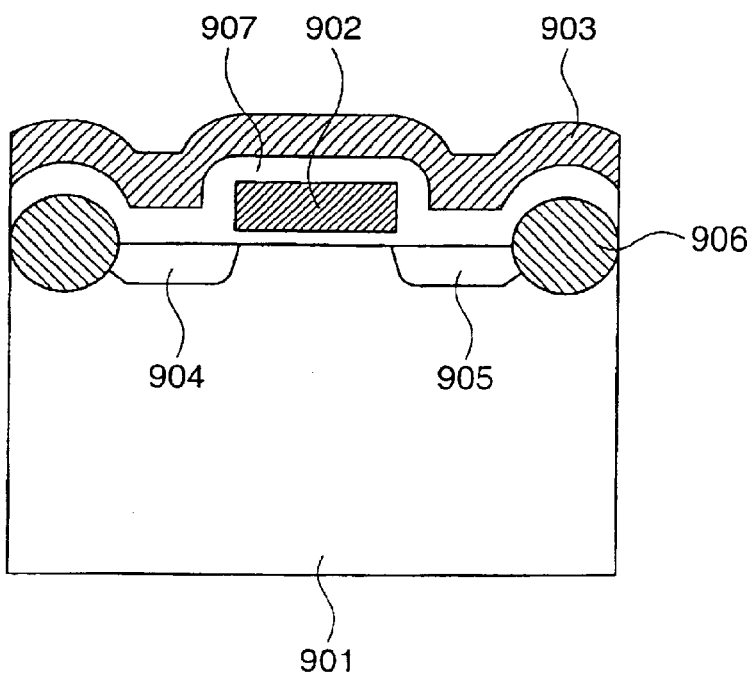
FIG. 24 is a schematic sectional view showing a main part of a conventional flash memory.

FIG. 23 shows a portable telephone as a portable electronic apparatus in which the semiconductor memory device is assembled.

The portable telephone is constructed mainly by a control circuit 811, a battery 812, an RF (radio frequency) circuit 813, a display 814, an antenna 815, a signal line 816, a power source line 817 and the like. In the control circuit 811, the semiconductor memory device of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing cost of the portable electronic apparatus can be particularly reduced.

By using the semiconductor memory device capable of performing high-speed reading operation and whose process of mounting a memory part and a logic circuit part simultaneously is easy for a portable electronic apparatus, the operation speed of the portable electronic apparatus is increased, and the manufacturing cost can be reduced. Thus, a cheap, high-reliability, and high-performance portable electronic apparatus can be obtained.

It is possible to prevent any parasitic current at the adjacent cell in the memory array by the semiconductor memory device and the method for driving the semiconductor memory device according to the present invention.

Furthermore, according to the present invention, the memory cell includes a gate electrode formed on a semiconductor layer via a gate insulating film, a channel region disposed below the gate electrode, diffusion regions disposed on both sides of the channel region and having a conductive type opposite to that of the channel region, and memory functional units formed on both sides of the gate electrode and having a function of retaining charges. Consequently, a memory cell forming process has a very high affinity with a normal transistor forming process. Therefore, it is possible to remarkably reduce the number of masks and the number of processes in comparison with the case of the combination with a peripheral circuit including normal transistors by using a conventional flash memory as a nonvolatile memory cell. As a consequence, it is possible to enhance the yield in production of a chip and reduce a cost.

The memory functional unit of the memory cell includes a film having a surface substantially parallel with a surface of the gate insulating film and having the function of retaining charges. Consequently, it is possible to suppress variations of the memory effect, so as to increase the probability of a success in a rewriting operation. Thus, it is possible to set a maximum pulse value to a value smaller than that in the prior art, thereby completing the rewriting operation in a short period of time. In addition, it is possible to decrease the possibility of generation of a deficient rewriting operation.

The semiconductor layer in the memory cell has a region in the vicinity of the diffusion region is higher in concentration than a region in the vicinity of a surface of the semiconductor layer below the gate electrode. Consequently, the memory effect is enhanced, and further, the rewriting speed is increased. The memory cell includes a film having a surface substantially parallel with a surface of the gate insulating film and having the function of retaining charges and an insulating film for separating the film from the channel region or the semiconductor layer, the insulating film having a thickness thinner than the gate insulating film and not less than 0.8 nm. Therefore, the increase in charges induced in the channel region or the well region enhances the memory effect, and further, facilitates the implantation of the charges into the memory functional unit, thereby increasing the rewriting speed.

Consequently, since the memory effect is enhanced in the memory cell, it is possible to take a large design margin for determining the program (writing) state or the erasing state, so as to increase the probability of the success in the rewriting operation. Therefore, it is possible to set the maximum pulse value smaller than that in the prior art, so as to complete the rewriting operation in a short period of time. Moreover, it is possible to decrease the possibility of the generation of the deficient rewriting operation.

The memory functional unit of the memory cell includes a charge retention film extending substantially parallel with the side surface of the gate electrode, thereby increasing the rewriting speed.

In this manner, since the rewriting speed in the memory cell according to the present invention is higher than that in the prior art, it is possible to complete the rewriting operation in a shorter period of time than in the conventional flash memory.

Since at least a part of the memory functional unit in the memory cell overlaps a part of the diffusion region, the erasing operation can be performed at a negative voltage of an absolute value lower than that in the prior art.

Since the electronic apparatus, in particular, the portable electronic apparatus according to the present invention is provided with the above-described semiconductor memory device, it is possible to facilitate the process of combining the memory and the logic circuit, to increase the operating speed of the electronic apparatus, to reduce the manufacturing cost, and to provide the display device of a high reliability at a reduced cost.

What is claimed is:

1. A method for driving a semiconductor memory device comprising a memory array having a plurality of memory cells arranged in rows and columns, each memory cell including a gate electrode formed on a semiconductor layer via a gate insulating film, a channel region disposed below the gate electrode, a source and a drain as diffusion regions disposed on both sides of the channel region and having a conductive type opposite to that of the channel region, and memory functional units formed on both sides of the gate electrode and having a function of retaining charges, the method comprising the steps of:

selecting a row line connected to the gate electrode of the memory cell to be selected;

grounding a first column line connected to the source of the memory cell to be selected; and applying a first potential to a second column line and a second potential to a third column line at the same time, wherein the second column line is connected to the drain of the memory cell to be selected and the third column line is connected to the drain of a memory cell adjacent to the memory cell to be selected while other row lines in the memory array are separated from the second and third column lines, and the first potential is applied by a first circuit, the second potential is applied by a second circuit, the first potential conditionally allows a reading current to flow via the memory cell to be selected, and a value of the current indicates the content of the memory cell to be selected.

2. The method according to claim 1, wherein the first and second potentials are substantially equal in value to each other.

3. The method according to claim 2, wherein the second circuit has an output impedance lower than that of the first circuit.

4. A semiconductor memory device comprising:

a memory array having a plurality of memory cells arranged in rows and columns, each of the memory cells including a gate electrode formed on a semiconductor layer via a gate insulating film, a channel region disposed below the gate electrode, first and second diffusion regions disposed on both sides of the channel region and having a conductive type opposite to that of the channel region, and memory functional units formed on both sides of the gate electrode and having a function of retaining charges;

a plurality of row lines, in which the gate electrodes in all of the memory cells in the same row are connected to a common row line;

first and second column lines, to which the first and second diffusion regions in all of the cells in the same column are connected, respectively;

row decoding means for selecting a row line connected to a memory cell to be selected; and column decoding means for grounding a second column line connected to the memory cell to be selected and for connecting a first column line connected to the memory cell to be selected to a first potential applied from a first circuit, so as to conditionally allow a current to flow via the memory cell to be selected, thereby accessing the content of the memory cell to be selected, wherein the column decoding means connects another second column line connected to a memory cell adjacent to the memory cell to be selected to a second potential to be applied from a second circuit while all of other first and second column lines in the memory array are separated from the first and second potentials, so as to prevent any interference from the adjacent memory cell during an access period of the memory cell to be selected.

5. The semiconductor memory device according to claim 4, wherein the first and second potentials are substantially equal in value to each other, for protecting the selected cell from a parasitic current during a reading processing period.

6. The semiconductor memory device according to claim 5, wherein the second circuit has an output impedance lower than that of the first circuit.

7. The semiconductor memory device according to claim 6, further comprising:

a plurality of path gate transistors connected between adjacent first and second column lines to selectively de-bias the memory array during a writing period to avoid a trouble of adjacent cells.

8. The semiconductor memory device according to claim 4, wherein the memory functional unit of the memory cell includes a film having a surface substantially parallel with a surface of the gate insulating film and having the function of retaining charges.

9. The semiconductor memory device according claim 4, wherein the memory cell includes a film having a surface substantially parallel with a surface of the gate insulating film and having the function of retaining charges; and an insulating film for separating the film from the channel region or the semiconductor layer, the insulating film having a thickness thinner than the gate insulating film and not less than 0.8 nm.

10. The semiconductor memory device according to claim 4, wherein the semiconductor layer in the memory cell has a region in the vicinity of the diffusion region, the region having a concentration higher than a portion in the vicinity of a surface of the semiconductor layer below the gate electrode.

11. The semiconductor memory device according to claim 4, wherein at least a part of the memory functional unit of the memory cell overlaps a part of the diffusion region.

12. A portable electronic apparatus comprising the semiconductor memory device according to any one of claims 4 to 7.

13. A method for driving a semiconductor memory device comprising a plurality of memory cells arranged in rows and columns, each of the memory cells including a gate electrode formed on a semiconductor layer via a gate insulating film, a channel region disposed below the gate electrode, first and second diffusion regions disposed on both sides of the channel region and having a conductive type opposite to that of the channel region, and memory functional units formed on both sides of the gate electrode and having a function of retaining charges, and a plurality of row lines including first and second lines, in which the gate electrodes in all of the memory cells in the same row are connected to the same row line and first and second diffusion regions in all of the cells in the same column line are connected to the corresponding first and second column lines, respectively, the method comprising the steps of:

applying a first potential to a row line connected to a memory cell to be selected, so as to connect all of the first and second column lines on one side of the memory cell to be selected to a first node;

connecting all of the first and second column lines on the other side of the memory cell to be selected to a second node;

grounding the first node; and increasing a potential of the second node up to a second potential at a predetermined speed, so as to tunnel electrons to the gate electrode of the memory cell to be selected, wherein the predetermined speed is controlled in such a manner as to prevent data stored in adjacent cells from being disturbed by a potential between the first and second column lines connected to the selected memory cell.

14. The method according to claim 13, wherein the predetermined speed is 10 volt/µsec or less.

15. The method according to claim 13, wherein the first potential ranges from 3 V to 9 V.

16. The method according to claim 15, wherein the second potential ranges from 4 V to 10 V.

17. The method according to claim 1 or 13, wherein the memory functional unit of the memory cell includes a film having a surface substantially parallel with a surface of the gate insulating film and having the function of retaining charges.

18. The method according to claim 1 or 13, wherein the memory cell includes a film having a surface substantially parallel with a surface of the gate insulating film and having the function of retaining charges; and an insulating film for separating the film from the channel region or the semiconductor layer, the insulating film having a thickness thinner than the gate insulating film and not less than 0.8 nm.

19. The method according to claim 1 or 13, wherein the semiconductor layer in the memory cell has a region in the vicinity of the diffusion region, the region having a concentration higher than a portion in the vicinity of a surface of the semiconductor layer below the gate electrode.

20. The method according to claim 1 or 13, wherein at least a part of the memory functional unit of the memory cell overlaps a part of the diffusion region.

* * * * *